Figure 1:
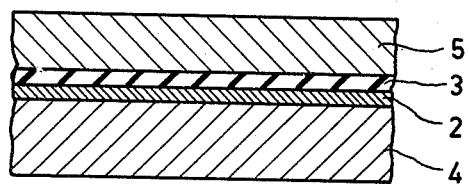

United States Patent [19]

Kroon

[11] 4,177,094
[45] Dec. 4, 1979

[54] METHOD OF TREATING A MONOCRYSTALLINE BODY UTILIZING A MEASURING MEMBER CONSISTING OF A MONOCRYSTALLINE LAYER AND AN ADJOINING SUBSTRATUM OF DIFFERENT INDEX OF REFRACTION

[75] Inventor: Simon G. Kroon, Stadskanaal, Netherlands

[73] Assignee: U.S. Philips Corporation, New York, N.Y.

[21] Appl. No.: 941,969

[22] Filed: Sep. 13, 1978

[30] Foreign Application Priority Data

Sep. 16, 1977 [NL] Netherlands .................. 7710164

[51] Int. Cl.² ............... H01L 21/66; H01L 21/20
[52] U.S. Cl. ............................... 148/175; 29/574; 148/1.5; 156/601; 156/626; 427/10
[58] Field of Search ............... 148/175, 1.5; 156/601, 156/626; 427/8–10; 29/574; 356/44, 51, 161, 201, 204

[56] References Cited

U.S. PATENT DOCUMENTS

| 3,099,579 | 7/1963 | Spitzer et al. ............... 156/601 |
| 3,449,071 | 6/1969 | Campbell et al. ............. 23/142 |
| 3,620,814 | 11/1971 | Clark et al. ................ 427/10 |
| 3,647,581 | 3/1972 | Mash ........................ 148/175 |
| 3,799,800 | 3/1974 | Thelen et al. ............... 427/10 |
| 4,024,291 | 5/1977 | Wilmanns .................... 427/10 |
| 4,118,857 | 10/1978 | Wong ........................ 29/574 |

OTHER PUBLICATIONS

Dupuis et al., "High-Efficiency . . . Vapor Deposition" Applied Physics Letters, vol. 31, No. 3, Aug. 1, 1977, pp. 201-203 (note p. 202).

*Primary Examiner*—L. Dewayne Rutledge
*Assistant Examiner*—W. G. Saba
*Attorney, Agent, or Firm*—Thomas A. Briody; Edward J. Connors, Jr.; Steven R. Biren

[57] ABSTRACT

A method in which a monocrystalline body is subjected in a gas atmosphere to a treatment for changing the thickness of the body, in which the thickness of the body is controlled by means of a measuring member which is subjected to the same treatment and which measuring member, on its side which is subjected to the treatment, consists of a monocrystalline layer and an adjoining substratum of a material having a refractive index differing of that the monocrystalline layer material. The measuring member is obtained by providing a substrate, depositing the monocrystalline layer on the substrate, forming the substratum on the monocrystalline layer, and then removing the substrate to form the measuring member.

7 Claims, 2 Drawing Figures

METHOD OF TREATING A MONOCRYSTALLINE BODY UTILIZING A MEASURING MEMBER CONSISTING OF A MONOCRYSTALLINE LAYER AND AN ADJOINING SUBSTRATUM OF DIFFERENT INDEX OF REFRACTION

The invention relates to a method in which a monocrystalline body is subjected in a gas atmosphere to a treatment changing the thickness of the body, in which the thickness of the body is controlled by means of a measuring member which is subjected to the same treatment and which measuring member, on the side which is subjected to the treatment, consists of a monocrystalline layer and an adjoining substratum of a material having an index of refraction differing from that of the monocrystalline material of the layer, and to a body obtained by means of the method.

A method of the kind mentioned above is disclosed in Netherlands Patent Application No. 76 05 871. In this application, the treatment changing the thickness of the body is a process in which silicon is deposited epitaxially from the gaseous phase on a monocrystalline silicon substrate. Furthermore a measuring member is used which has been obtained by implantation of nitrogen ions in a monocrystalline silicon body so that a monocrystalline silicon layer is formed on a substratum of silicon nitride with the remainder of the silicon body on the other side of the silicon nitride substratum.

Information on the thickness of the epitaxial layer is obtained from interference measurements. This may be interference of radiation originating from the monocrystalline layer directly emanating from the layer with radiation which is first reflected by the substratum. Alternatively, interference may be measured of incident laser light which is partly reflected by the surface of the monocrystalline layer and partly by the substratum.

In order to obtain a decisive interference pattern it is necessary for the monocrystalline layer to be of a quality which is comparable to that of the body to be treated.

It is also desirable for the substratum of the measuring member to be homogeneous in composition and thickness and also for the thickness of the monocrystalline layer to be constant.

A good quality of monocrystalline layer and substrate, however, is difficult to realize with the above-described known method.

For example, in order to obtain a satisfactory reflecting substratum by implantation, a high dose of ions to be implanted is necessary, which ions have to be implanted at high energy so that a comparatively large number of crystal damages occur which are not completely eliminated by thermal treatment and because of which the measuring member and the body to be treated are difficult to compare.

In general the implantation depth is not large so that in the case of treatments in which reductions in thickness occur the duration of control is restricted.

The reaction between the material of the measuring member and the implanted ions often is also insufficient so that the interface between the monocrystalline layer and the substratum and also the reflection at that area is poorly defined.

One of the objects of the invention is to avoid the above-mentioned disadvantages at least to a considerable extent. The invention is based inter alia on the recognition of the fact that the formation of the substratum on the monocrystalline layer is to be preferred over the formation on the substratum in a monocrystalline body.

According to the disclosed invention, the method is therefore characterized in that a measuring member is used in which the substratum is provided on a free surface of the monocrystalline layer.

By means of the method according to the invention, the substratum can be provided in a usual manner without the monocrystalline layer being damaged.

The substratum may be of, for example, silicon dioxide, silicon nitride or silicon carbide, which can easily be obtained in the form of layers of homogeneous composition and thickness.

Of course, the thickness of the monocrystalline layer may also be chosen within wide limits.

The measuring member is preferably used in the epitaxial deposition of a layer of semiconductor material on a substrate as a treatment which causes the thickness of the body to increase.

However, by means of the method according to the invention, a treatment, for example etching, which causes the thickness of the body to decrease, can also be controlled.

Successive etching and epitaxial treatments can also be controlled in the described manner.

A measuring member for use in the method according to the invention can be obtained in a comparatively simple manner by epitaxially depositing the monocrystalline layer on a substrate differing from the monocrystalline layer at least as regards conductivity properties, then providing the substratum and removing the substrate.

The last-mentioned substrate is preferably removed by means of an etching process which is selective with respect to the monocrystalline layer.

Such etching processes can easily be indicated if, in the treatment, semiconductor material is transported belonging to the group consisting of silicon and III–V compounds. As a substratum it is preferable to use a layer of silicon nitride or of silicon dioxide and, in order to increase the rigidity of the measuring member, a layer of polysilicon is provided on the substratum.

The invention also relates to a monocrystalline body treated by means of the method according to the invention.

The invention will now be described in greater detail with reference to an example and the accompanying drawing.

Figure 2:
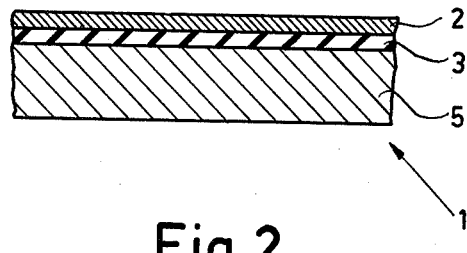

FIGS. 1 and 2 of the drawing are diagrammatic sectional views of a measuring member used in the method according to the invention in successive stages of its manufacture.

In the example, a monocrystalline silicon body is subjected in a gas atmosphere to treatments changing the thickness of the body. The thickness of the body is controlled by means of a measuring member 1 which is subjected to the same treatments.

The measuring member 1 on its side which is subjected to the treatment consists of a monocrystalline layer 2 and an adjoining substratum 3 of a material having an index of refraction differing from that of the monocrystalline layer of material.

According to the invention a measuring member is used in which the substratum is provided on a free surface of the silicon layer 2.

The measuring member 1 is obtained by depositing epitaxially a 3 μm thick monocrystalline layer 2 of the n-type on a disc-shaped substrate 4 of monocrystalline silicon of the n+type having a diameter of 5 cm and a thickness of 200 μm.

A substratum 3 of silicon nitride (0.3 μm thick) or silicon dioxide (0.45 μm thick) is provided on layer 2 and then a 200 μm thick high-ohmic polysilicon layer 5 is provided.

The substrate 4 is then removed by means of an etching process which etches selectively with repect to the monocrystalline layer 2.

Silicon has a refractive index of 3.42, while silicon nitride a refractive index of 2.00.

The resulting disc-shaped structure is then severed in the usual manner to form measuring members 1 having an area of 7 mm×77 mm.

Conventionally used methods may be applied in the treatments changing the thickness and in the manufacture in the measuring member.

The said selective etching process may be carried out in a suitable etching bath, if desired electrochemically, if desired succeeding a partial mechanical removal of the substrate 4.

In the present example, the body to be treated and the measuring member are placed in a reactor and are successively subjected to an etching treatment in an atmosphere containing hydrogen chloride and then to an epitaxial treatment in an atmosphere containing silicon tetrachloride.

Changes in thickness are recorded in the usual manner by measuring the intensity of the radiation emanating from the monocrystalline layer. The time difference between the recording of two successive intensity maxima corresponds to an increase or decrease of the thickness which depends on the wavelength of the recorded radiation, and also on the emanating angle of the radiation and in particular on the refractive index of the material of the layer.

It has been found that changes in thickness of approximately 6 μm corresponding to 20 cycles of approximately 0.3 μm in the intensity variations can be recorded.

Limits are imposed upon the number of cycles of intensity variations by the bandwidth of the recorded radiation, the scatter by the substratum and absorption of the radiation in the growing material.

Besides by recording emitted radiation, in the case of silicon infrared radiations reflection of laser radiation can also be measured in which less extinction occurs when the layer thickness increases.

The invention is not restricted to the example described.

For example, instead of an amorphous substratum, for example silicon nitride, a monocrystalline substratum, for example of sapphire, may alternatively be used.

The thickness control described may be used in a process to control the growth rate of an epitaxial layer.

In addition to silicon, for example, III–V-compounds can be grown by means of the method according to the invention.

The material of the body to be treated may, but need not necessarily be equal to that of the monocrystalline layer of the measuring member.

What is claimed is:

1. A method of manufacturing a semiconductor device which comprises the steps of:
providing a monocrystalline semiconductor body;
subjecting said body to a treatment in a gas atmosphere which changes the thickness of said body;
controlling the thickness of said body by means of a measuring member which is subjected to the same treatment, said member comprising a monocrystalline layer and an adjoining substratum of a material having a refractive index differing from that of the monocrystalline layer, the process of obtaining said measuring member comprising the steps of:
providing a substrate;
depositing said monocrystalline layer on said substrate;
forming the substratum on said monocrystalline layer; and
forming the measuring member by removing said substrate so as to leave a composite structure of said monocrystalline layer and said substratum.

2. A method of manufacturing a semiconductor device as in claim 1, wherein the treatment in a gas atmosphere causes the thickness of said body to increase, which comprises the step of epitaxially depositing at least one layer of semiconductor material on said body.

3. A method of manufacturing a semiconductor device as in claim 1, wherein the step of removing said substrate comprises the step of selectively etching said substrate from said monocrystalline layer.

4. A method of manufacturing a semoconductor device as in claim 1, wherein a layer of polysilicon is provided on said substratum.

5. A method of manufacturing a semiconductor device as in claim 2, wherein the semiconductor material is selected from the group consisting of silicon and the III–V compounds.

6. A method of manufacturing a semiconductor device as in claim 1, wherein said substrate and said monocrystalline layer are of differing conductivity types and wherein said monocrystalline layer is epitaxially deposited.

7. A method of manufacturing a semiconductor device as in claims 1, 2, 3, 4, 5 or 6, wherein said substratum consists of silicon nitride or silicon dioxide.

* * * * *